US012775058B2

(12) United States Patent
Horio

(10) Patent No.: US 12,775,058 B2
(45) Date of Patent: Oct. 27, 2026

(54) MAGNETIC RESONANCE IMAGING APPARATUS

(71) Applicant: Canon Kabushiki Kaisha, Tokyo (JP)

(72) Inventor: Daisuke Horio, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 138 days.

(21) Appl. No.: 18/651,826

(22) Filed: May 1, 2024

(65) Prior Publication Data

US 2025/0060434 A1 Feb. 20, 2025

(30) Foreign Application Priority Data

Aug. 14, 2023 (JP) ................................ 2023-131798

(51) Int. Cl.
*G01R 33/36* (2006.01)

(52) U.S. Cl.
CPC ..... *G01R 33/3692* (2013.01); *G01R 33/3621* (2013.01)

(58) Field of Classification Search
CPC ........................ G01R 33/3692; G01R 33/3621
See application file for complete search history.

(56) References Cited

U.S. PATENT DOCUMENTS 8,502,540 B2 * 8/2013 Nakanishi .......... G01R 33/3692 324/318
11,874,352 B2 * 1/2024 Bollenbeck .......... G01R 33/482
2011/0227571 A1 * 9/2011 Sekiguchi .......... G01R 33/3692 324/307
2015/0022206 A1 * 1/2015 Adolf .................. G01R 33/288 324/309
2015/0253394 A1 * 9/2015 Tomiha .............. G01R 33/3657 324/318
2016/0154074 A1 * 6/2016 Okamoto ........... G01R 33/5659 324/322
2019/0025399 A1 * 1/2019 Uchida .............. G01R 33/3692
2020/0408862 A1 * 12/2020 Reykowski ........ G01R 33/3621

FOREIGN PATENT DOCUMENTS

JP 5749317 B2 7/2015

* cited by examiner

*Primary Examiner* — Dominic E Hawkins
(74) *Attorney, Agent, or Firm* — Oblon, McClelland, Maier & Neustadt, L.L.P.

(57) ABSTRACT

A magnetic resonance imaging apparatus according to an embodiment includes a main apparatus and a coil apparatus that is separate from the main apparatus. The main apparatus includes a first timer configured to operate on a synchronization clock. The coil apparatus includes processing circuitry and a second timer. The processing circuitry regenerates the synchronization clock from a first wireless signal transmitted by the main apparatus, and detects a timing where a second wireless signal transmitted by the main apparatus is received. The second timer operates on the synchronization clock. The magnetic resonance imaging apparatus performs synchronized imaging operations by correcting at least one of the first timer provided to the main apparatus and the second timer provided to the coil apparatus according to the timing.

14 Claims, 8 Drawing Sheets

MAGNETIC RESONANCE IMAGING APPARATUS

CROSS-REFERENCE TO RELATED APPLICATIONS

This application is based upon and claims the benefit of priority from Japanese Patent Application No. 2023-131798, filed on Aug. 14, 2023; the entire contents of which are incorporated herein by reference.

FIELD

Embodiments described herein relate generally to a magnetic resonance imaging apparatus.

BACKGROUND

A magnetic resonance imaging (MRI) apparatus is an imaging apparatus that excites the nuclear spins of a subject placed in a static magnetic field with radio frequency (RF) pulse signals at Larmor frequency, and reconstructs magnetic resonance (MR) signals generated from the subject as a result of the excitation to generate images.

In an MRI apparatus, RF pulses are transmitted from a main unit toward the subject. The MR signals emitted from the subject in response to the transmission are received by a coil unit. The coil unit receives the MR signals emitted from the subject at a position close to the subject. As for the coil unit, there are various types such as for the head, chest, spine, and lower limbs, depending on the imaging areas of the subject.

Conventionally, wired coil units that transfer received MR signals to the main unit by wire are often used. In contrast, a wireless coil unit has been proposed, which converts received MR signals from analog signals to digital signals using an analog to digital converter (ADC) and wirelessly transfers the digitized MR signals to the main unit.

When using a wired coil unit, the imaging operations of the main unit and the coil unit are controlled according to a determined time schedule (hereinafter, pulse sequence). Furthermore, imaging is performed by controlling the coil unit from the main unit according to the pulse sequence.

On the other hand, when using a wireless coil unit, the timing at which a control signal from the main unit to the coil unit changes needs to be transferred wirelessly according to a pulse sequence.

Note here that if the timing at which the control signal of the coil unit changes is transferred with a large delay compared to the case of wired connection, the imaging operation synchronized with the main unit may be disrupted and imaging may not be performed properly. Factors that may prevent correct imaging include, for example, a shift in the timing for enabling the coil unit when receiving MR signals by the coil unit, settings of the coil unit are not made at a default timing, and the like.

For example, as a conventional technology, a method of regenerating synchronization clocks using wireless communication has also been proposed. However, this method may cause a shift in the timing at which the control signal changes when the control signal transmitted from the main unit is regenerated in the coil unit due to the effects of fading that occurs on a wireless propagation path. Furthermore, in the pulse sequence, there are a plurality of timing points at which the control signal of the coil unit changes. Therefore, the condition of the wireless propagation path may change each time due to the effects of body movements and the like caused by breathing and the like of a person and cause different timing shift every time, thereby making it difficult to correct each of the timings.

DETAILED DESCRIPTION

An MRI apparatus according to an embodiment includes a main apparatus and a coil apparatus that is separate from the main apparatus. The main apparatus includes a first timer configured to operate on a synchronization clock. The coil apparatus includes a clock regeneration unit, a second timer, and a detection unit. The clock regeneration unit regenerates the synchronization clock from a first wireless signal transmitted by the main apparatus. The second timer operates on the synchronization clock. The detection unit detects the timing at which a second wireless signal transmitted by the main apparatus is received. The MRI apparatus performs synchronized imaging operations by correcting at least one of the first timer provided to the main apparatus and the second timer provided to the coil apparatus according to the timing.

Embodiment

Hereinafter, an MRI apparatus according to the present embodiment will be described with reference to the accompanying drawings.

Figure 1:
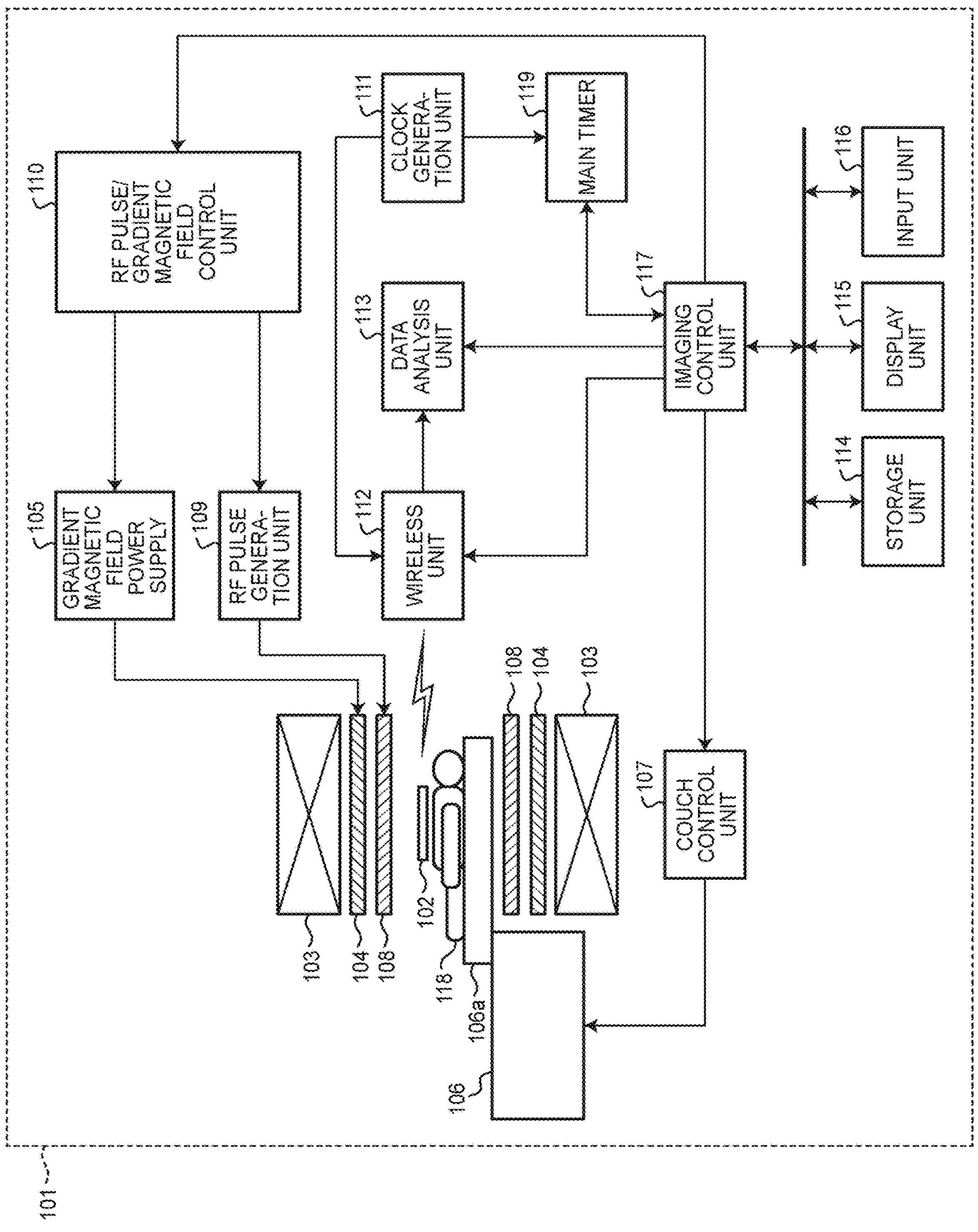
FIG. 1 is a diagram illustrating a configuration example of an MRI apparatus.

FIG. 1 is a diagram illustrating a configuration example of the MRI apparatus.

The MRI apparatus includes a main unit 101 and a coil unit 102. The main unit 101 includes a static magnetic field magnet 103, a gradient coil 104, a gradient magnetic field power supply 105, a couch 106, a couch control unit 107, a transmitter coil 108, an RF pulse generation unit 109, an RF pulse/gradient magnetic field control unit 110, a clock generation unit 111, a wireless unit 112, a data analysis unit 113, a storage unit 114, a display unit 115, an input unit 116, and an imaging control unit 117. Note that the main unit 101 may also be divided into a gantry and a processing unit. In this case, for example, the static magnetic field magnet 103, the gradient coil 104, the gradient magnetic field power supply 105, the couch 106, the couch control unit 107, the transmitter coil 108, the RF pulse generation unit 109, the RF pulse/gradient magnetic field control unit 110, and the wireless unit 112 are provided in the gantry, and the clock generation unit 111, the data analysis unit 113, the storage unit 114, the display unit 115, the input unit 116, and the imaging control unit 117 are provided in the processing unit. Note here that the main unit 101 is an example of the main apparatus. The coil unit 102 is also an example of the coil apparatus.

The static magnetic field magnet 103 has a hollow cylindrical shape, and generates a uniform static magnetic field in the inside space. For example, a permanent magnet, a superconducting magnet, or the like is used as this static magnetic field magnet 103.

The gradient coil 104 has a hollow cylindrical shape, and it is disposed on the inner side of the static magnetic field magnet 103. The gradient coil 104 is a combination of three kinds of coils corresponding to the X, Y, and Z axes orthogonal to each other. By receiving current supply at the three kinds of coils individually from the gradient magnetic field power supply 105, the gradient coil 104 generates gradient magnetic fields whose magnetic field strength is inclined along each of the X, Y, and Z axes. Note that the Z-axis direction is the same direction as the static magnetic field direction, for example. The gradient magnetic fields of the X, Y, and Z axes correspond, for example, to a slice selection gradient magnetic field Gs, a phase encoding gradient magnetic field Ge, and a readout gradient magnetic field Gr, respectively. The slice selection gradient magnetic field Gs is used to determine an imaging cross section as desired. The phase encoding gradient magnetic field Ge is used to change the phase of the MR signal in accordance with spatial location. The readout gradient magnetic field Gr is used to change the frequency of the MR signal in accordance with a spatial location.

The couch 106 moves a couchtop 106*a* in the longitudinal direction (left-and-right direction in FIG. 1) and the up-and-down direction under the control of the couch control unit 107. Normally, the couch 106 is installed such that the longitudinal direction is parallel to the central axis of the static magnetic field magnet 103. A subject 118 is placed on the couchtop 106*a*. The couch 106 inserts the subject 118 into the space (imaging space) inside the gradient coil 104 by moving the couchtop 106*a*.

The transmitter coil 108 is configured by housing a single or a plurality of coils in a cylindrical case. The transmitter coil 108 is disposed on the inner side of the gradient coil 104. The transmitter coil 108 receives supply of RF pulse signals from the RF pulse generation unit 109 and emits RF pulses.

The imaging control unit 117 includes a central processing unit (CPU), a memory, and the like, not illustrated, plays the role of overall imaging control of the main unit, and executes pulse sequence information in accordance with a main timer 119. Furthermore, the imaging control unit 117 transfers in advance the pulse sequence information to the coil unit 102 from the wireless unit 112. Note here that the pulse sequence information is information that specifies each of the gradient magnetic fields, application timing of the RF pulse, setting values, and the like.

The imaging control unit 117 also generates synchronization correction timing for synchronizing the main timer 119 provided to the main unit 101 and a coil timer 226 provided to the coil unit 102 based on a clock from the clock generation unit 111. Note here that the synchronization correction timing is a 1-bit digital signal that is a signal representing the timing for correcting synchronization at the rising edge from 0 to 1, for example. The synchronization correction timing is used by the imaging control unit 117 as the timing to reset the main timer 119 or to acquire the timer value of the main timer 119. Furthermore, the imaging control unit 117 outputs the synchronization correction timing to the RF pulse/gradient magnetic field control unit 110 in order to generate RF pulses based on the synchronization correction timing. Note here that the imaging control unit 117 is an example of a second wireless signal transmitter unit.

The RF pulse generation unit 109 generates RF pulse signals.

The RF pulse/gradient magnetic field control unit 110 controls the gradient magnetic field power supply 105 and the RF pulse generation unit 109 according to the pulse sequence information input from the imaging control unit 117. The RF pulse/gradient magnetic field control unit 110 also controls the RF pulse generation unit 109 to emit the RF pulses according to the synchronization correction timing input from the imaging control unit 117. Note that RF pulses emitted herein based on the synchronization correction timing are directly detected by the coil unit 102. Therefore, the RF pulse/gradient magnetic field control unit 110 may control the emission of RF pulses based on the synchronization correction timing with a weaker intensity than that of the RF pulses emitted during imaging.

The coil unit 102 is placed on the couchtop 106*a*, built into the couchtop 106*a*, or attached to the subject 118. Then, during imaging, the coil unit 102 is inserted into the imaging space together with the subject 118, and receives magnetic resonance echo emitted from the subject 118 to acquire electrical echo signals. The coil unit 102 transmits, to the wireless unit 112, echo data acquired by digitalizing the echo signals. Furthermore, the coil unit 102 receives wireless clock signals from the wireless unit 112 to synchronize the system clocks with each other.

The clock generation unit 111 generates a first clock signal at a prescribed frequency. The first clock signal is given to the wireless unit 112 and the main timer 119, and it is also used as the system clock that serves as the reference for the operation timing of the entire MRI apparatus. Note here that the clock generation unit 111 is an example of a clock generation unit.

The main timer 119 is configured with a counter that operates based on the system clock, and the timer values of the main timer 119 are used to execute the pulse sequence according to a time schedule. The main timer 119 herein may operate as a clock that handles time based on the system clock. Note here that the main timer 119 is an example of a first timer.

The data analysis unit 113 analyzes the echo data, and reconstructs an image regarding the subject 118.

The storage unit 114 stores therein various kinds of data such as image data representing images reconstructed by the data analysis unit 113.

The display unit 115 displays various kinds of information such as images reconstructed by the data analysis unit 113 and various operation screens for allowing users to operate the MRI apparatus, under the control of the imaging control unit 117. As the display unit 115, it is possible to use a display device such as a liquid crystal display.

The input unit 116 receives various kinds of commands and information input from the operator. As the input unit 116, it is possible to use a pointing device such as a mouse or a trackball, a selection device such as a mode switch, or an input device such as a keyboard as appropriate.

Figure 2:
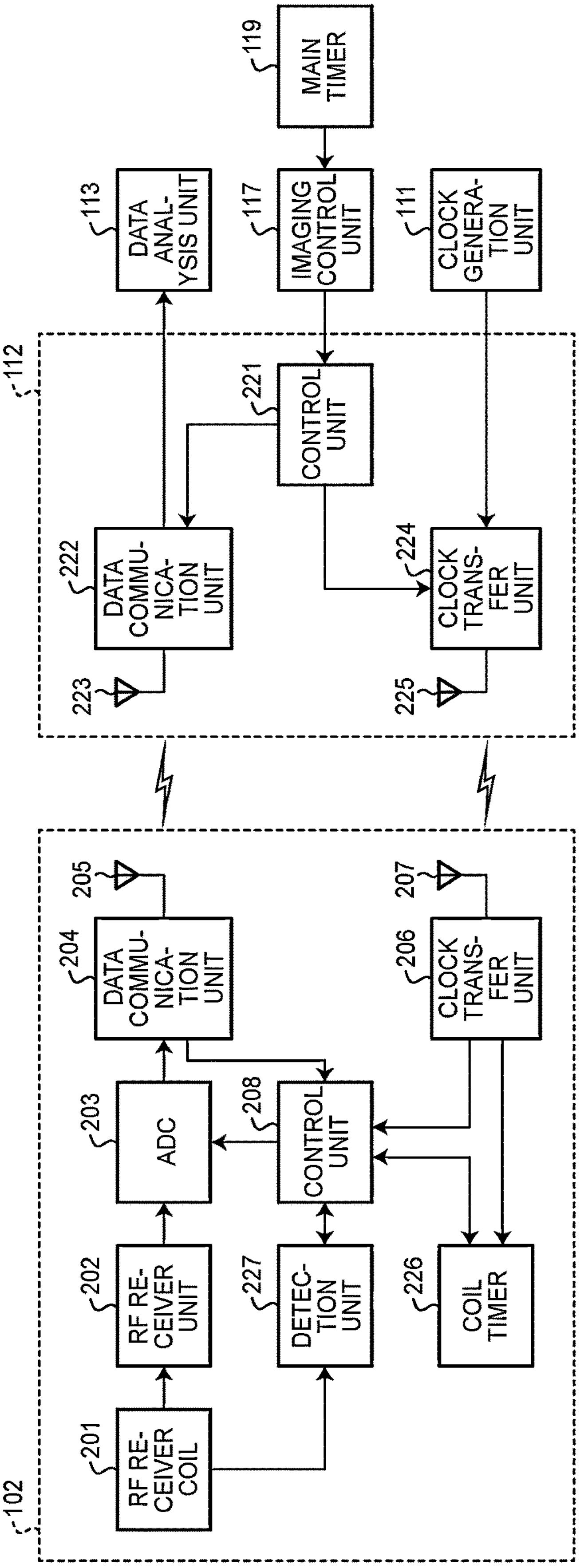
FIG. 2 is a block diagram illustrating functional configurations of a coil unit and a wireless unit.

FIG. 2 is a block diagram illustrating the functional configurations of the coil unit 102 and the wireless unit 112.

In FIG. 2, the same reference signs are applied to the same components as those of FIG. 1, and redundant explanations are omitted.

The coil unit 102 includes an RF receiver coil 201, an RF receiver unit 202, an ADC 203, a data communication unit 204, a data communication antenna 205, a clock transfer unit 206, a clock transfer antenna 207, a control unit 208, a detection unit 227, and the coil timer 226.

The RF receiver coil 201 receives magnetic resonance echo emitted from the subject 118 to acquire electrical echo signals. The RF receiver coil 201 also receives RF pulses based on the synchronization correction timing to acquire electrical RF pulse signals. Note here that the RF receiver coil 201 is an example of an RF receiver coil.

The detection unit 227 detects the envelope of the RF pulse signal to receive and regenerate the synchronization correction timing. It is assumed herein that the timing for enabling the detection unit 227 to receive the synchronization correction timing is notified in advance from the main unit 101 through the data communication unit 204. Note here that the detection unit 227 is an example of a detection unit.

The RF receiver unit 202 includes a variable amplifier that amplifies the echo signal acquired by the RF receiver coil 201, and amplifies the echo signal to an appropriate level in the previous stage of the ADC 203 to suppress the effect of quantization errors.

The ADC 203 performs analog-to-digital conversion of the echo signals that are analog signals output by the RF receiver unit 202 based on the sampling clock supplied by the control unit 208 to acquire the echo data as the digital signals.

The data communication unit 204 is configured with a modulation/demodulation circuit, a frequency conversion circuit, a power amplification circuit, and the like. The data communication unit 204 generates a communication frame by adding a header and the like to the echo data input from the ADC 203. Furthermore, the data communication unit 204 performs modulation processing, frequency conversion processing, and the like on the communication frame to generate wireless communication signals, and transmits those from the data communication antenna 205.

The data communication unit 204 also receives wireless communication signals transmitted from a data communication unit 222 via the data communication antenna 205. Then, frequency conversion processing, demodulation processing, and the like are performed on the received wireless communication signals to acquire reception data. Pulse sequence information, a timer correction value, timing for enabling the detection unit 227 and the like are received as the reception data, and stored in the memory provided to the control unit 208.

Note that the data communication unit 204 may be configured to control wireless communication in compliance with the IEEE 802.11 standard. The data communication unit 204 may also be configured to control wireless communication in compliance with communication standards such as Bluetooth (registered trademark), NFC, UWB, Zigbee, and MBOA. UWB is an abbreviation for Ultra Wide Band, and MBOA is an abbreviation for Multi Band OFDM Alliance. Note here that OFDM is an abbreviation for Orthogonal Frequency Division Multiplexing. Furthermore, NFC is an abbreviation for Near Field Communication. Wireless USB, wireless 1394, Winet, and the like are included in UWB.

The clock transfer unit 206 receives the wireless clock signal transmitted by a clock transfer unit 224 via the clock transfer antenna 207. Note here that the wireless clock signal is a wireless signal for synchronizing the frequencies of the system clocks of the main unit 101 and the coil unit 102. The clock transfer unit 206 regenerates the system clock from the wireless clock signal received by the clock transfer antenna 207, and outputs it to the control unit 208 and the coil timer 226. Note here that the clock transfer unit 206 is an example of a clock regeneration unit.

The coil timer 226 is configured with a counter whose operating clock is the system clock regenerated by the clock transfer unit 206, and the timer value is used to execute the received pulse sequence information according to a time schedule. The coil timer 226 may also operate as a clock with the system clock being the operating clock. Note here that the coil timer 226 is an example of a second timer.

The control unit 208 includes a CPU, a memory, and the like, not illustrated, plays the role of overall imaging control of the coil unit 102, and executes the pulse sequence information received via the data communication unit 204 in accordance with the coil timer 226. The control unit 208 also resets the coil timer 226 or acquires the timer value of the coil timer 226 according to the synchronization correction timing received by the detection unit 227. Furthermore, the control unit 208 generates a sampling clock from the system clock using a phase locked loop (PLL) circuit, not illustrated, and outputs it to the ADC 203.

The wireless unit 112 includes a control unit 221, the data communication unit 222, a data communication antenna 223, the clock transfer unit 224, and a clock transfer antenna 225. The control unit 221 wirelessly transmits pulse sequence information input from the imaging control unit 117 to the coil unit 102 by the data communication unit 222. The control unit 221 also controls operations of the clock transfer unit 224 based on the pulse sequence information.

The configurations of the data communication unit 222 and the data communication antenna 223 are the same as those of the data communication unit 204 and the data communication antenna 205. The data communication unit 222 receives wireless communication signals transmitted from the data communication unit 204 via the data communication antenna 223. Then, echo data is acquired from the received wireless communication signals and output to the data analysis unit 113. Furthermore, the data communication unit 222 generates the wireless communication signals from the pulse sequence information input from the control unit 221, and transmits those to the coil unit 102.

The clock transfer unit 224 generates wireless clock signals based on input from the clock generation unit 111 and the control unit 221, and transmits those from the clock transfer antenna 225. For example, the clock transfer unit 224 transmits the wireless clock signals as wireless signals in the frequency bands used in wireless LANs (Local Area Networks), such as wireless signals in the frequency bands used by the IEEE 802.11 standard, Bluetooth (registered trademark), NFC, UWB, Zigbee, MBOA, and the like. Note here that the clock transfer unit 224 is an example of a first wireless signal transmitter unit.

Subsequently, configurations and operations of the clock transfer unit 206 and the clock transfer unit 224 will be described.

Figure 3:
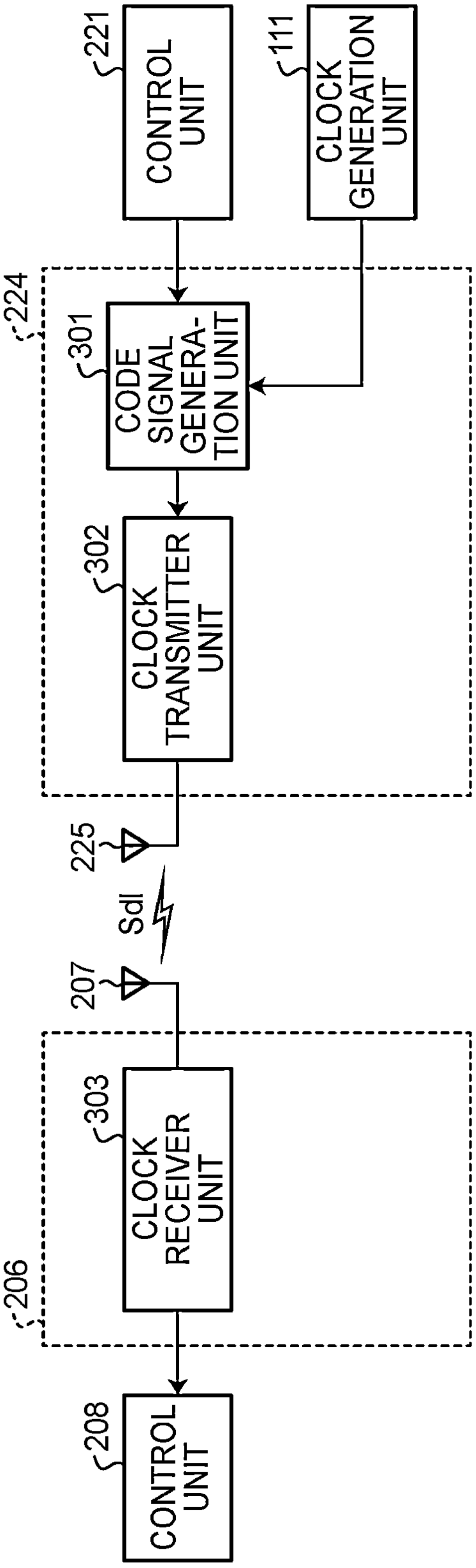
FIG. 3 is a block diagram illustrating a functional configuration of clock transfer units.

FIG. 3 is a block diagram illustrating the functional configuration of the clock transfer unit 206 and the clock transfer unit 224.

The clock transfer unit 224 includes a code signal generation unit 301 and a clock transmitter unit 302.

The code signal generation unit 301 generates a code signal that is encoded based on the first clock signal input from the clock generation unit 111, and outputs it to the clock transmitter unit 302.

The clock transmitter unit 302 generates a wireless clock signal Sd1 based on the code signal input from the code signal generation unit 301, and transmits it from the clock transfer antenna 225.

The clock transfer unit 206 includes a clock receiver unit 303.

The clock receiver unit 303 receives the wireless clock signal Sd1 transmitted from the clock transfer unit 224 at the clock transfer antenna 207. Then, the clock receiver unit 303 divides the wireless clock signal Sd1, generates a second clock signal using a PLL or the like with a jitter cleaner function, and outputs it to the control unit 208. At this time, the second clock signal is equivalent to the first clock signal, and the system clocks of the entire MRI apparatus are synchronized. However, when frequency division or the like is performed by the control unit 208, the second clock signal and the first clock signal may be in a relationship of integer multiple or integer fraction. Note here that signals modulated by a binary continuous phase frequency shift keying (CPFSK) scheme or non-continuous phase frequency modulation signals are used for the wireless clock signals that are transmitted and received by the clock transmitter unit 302 and the clock receiver unit 303.

Subsequently, the configuration and operations of the detection unit 227 will be described.

Figure 4:
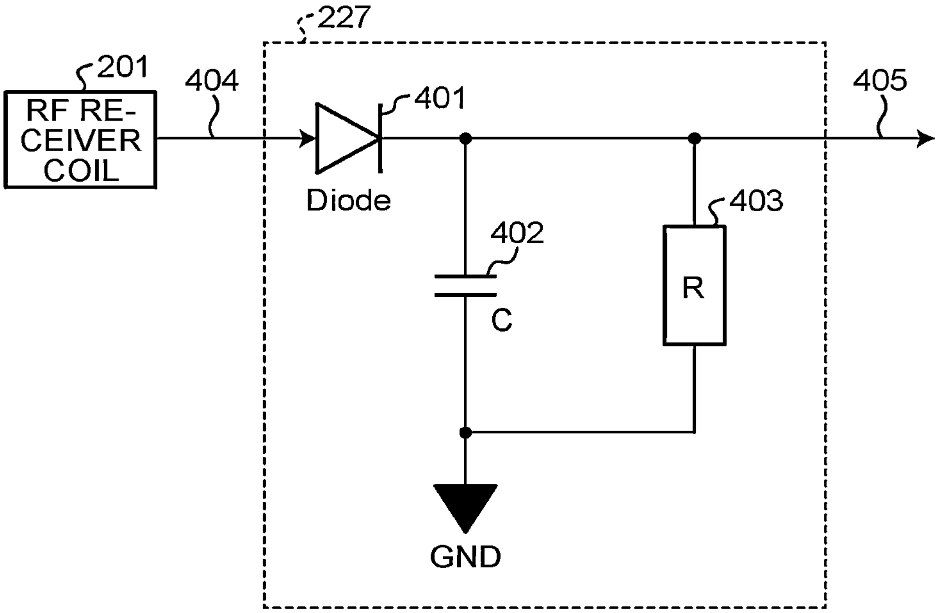
FIG. 4 is a block diagram illustrating a functional configuration of a detection unit.

FIG. 4 is a block diagram illustrating the functional configuration of the detection unit 227.

The detection unit 227 is an envelope detection circuit that can be configured with a diode 401, a capacitor 402, and a resistor 403. Note that the detection unit 227 may include an automatic gain control (AGC) circuit and a bandwidth limiting filter, not illustrated, to adjust the amplitude of an RF pulse signal 404 from the RF receiver coil 201 and input it to the diode 401. The diode 401 rectifies the RF pulse signal. The time constants of the capacitor 402 and the resistor 403 are determined according to the cycle of the RF pulse signals, and a synchronization correction timing 405 that is the envelope of the RF pulse signal 404 is output. Note that the circuit configuration illustrated herein is only an example, and any other circuit may be used as long as the circuit configuration thereof is capable of regenerating the synchronization correction timing transferred by the RF pulse signals.

Figure 5:
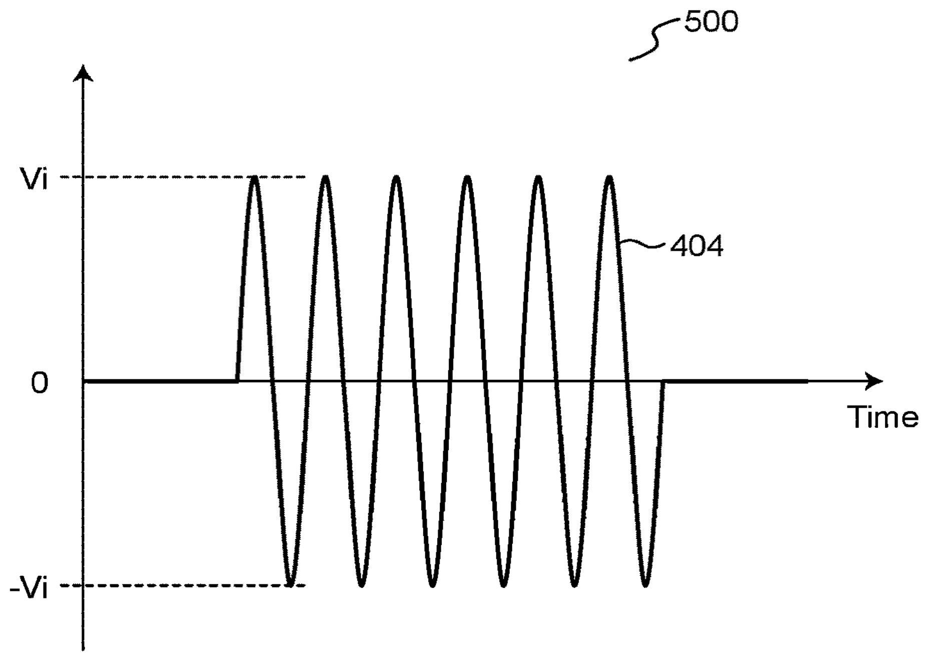
FIG. 5 is a diagram illustrating a time waveform of an RF pulse signal.

FIG. 5 is a diagram illustrating a time waveform of the RF pulse signal 404.

The RF pulse signal 404 for transferring the synchronization correction timing from the RF receiver coil 201 is at a frequency that can be detected by the RF receiver coil 201. For example, it can be implemented by outputting a continuous sine wave 500 only during the period when the synchronization correction timing becomes 1. Here, as the frequency when emitting the RF pulses, it is possible to use wireless signals with the frequency included in the Larmor frequency band, such as 63.9 MHz or 128 MHz, for example.

Figure 6:
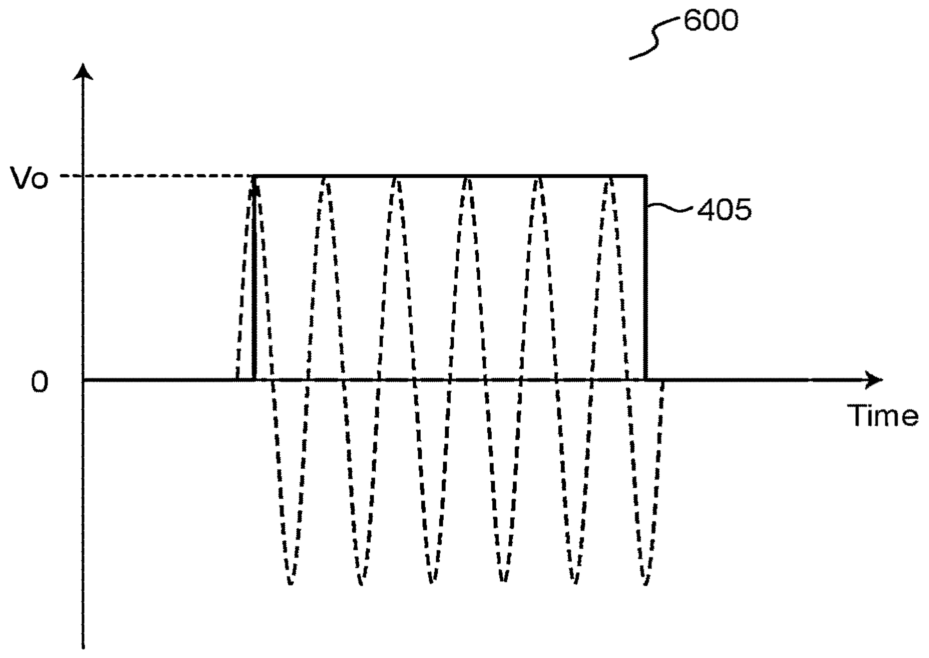
FIG. 6 is a diagram illustrating a time waveform of a regenerated synchronization correction timing.

FIG. 6 is a diagram illustrating a time waveform of the regenerated synchronization correction timing 405.

The synchronization correction timing regenerated by the detection unit 227 is a rectangular output that is an envelope 600 of a sine wave 500, and the synchronization correction timing generated and transmitted as the RF pulse by the imaging control unit 117 is regenerated in the coil unit 102.

Subsequently, the operation for allowing the coil timer 226 to establish timer synchronization with the main timer 119 in the MRI apparatus according to the present embodiment having the above-described configuration will be described.

Figure 7:
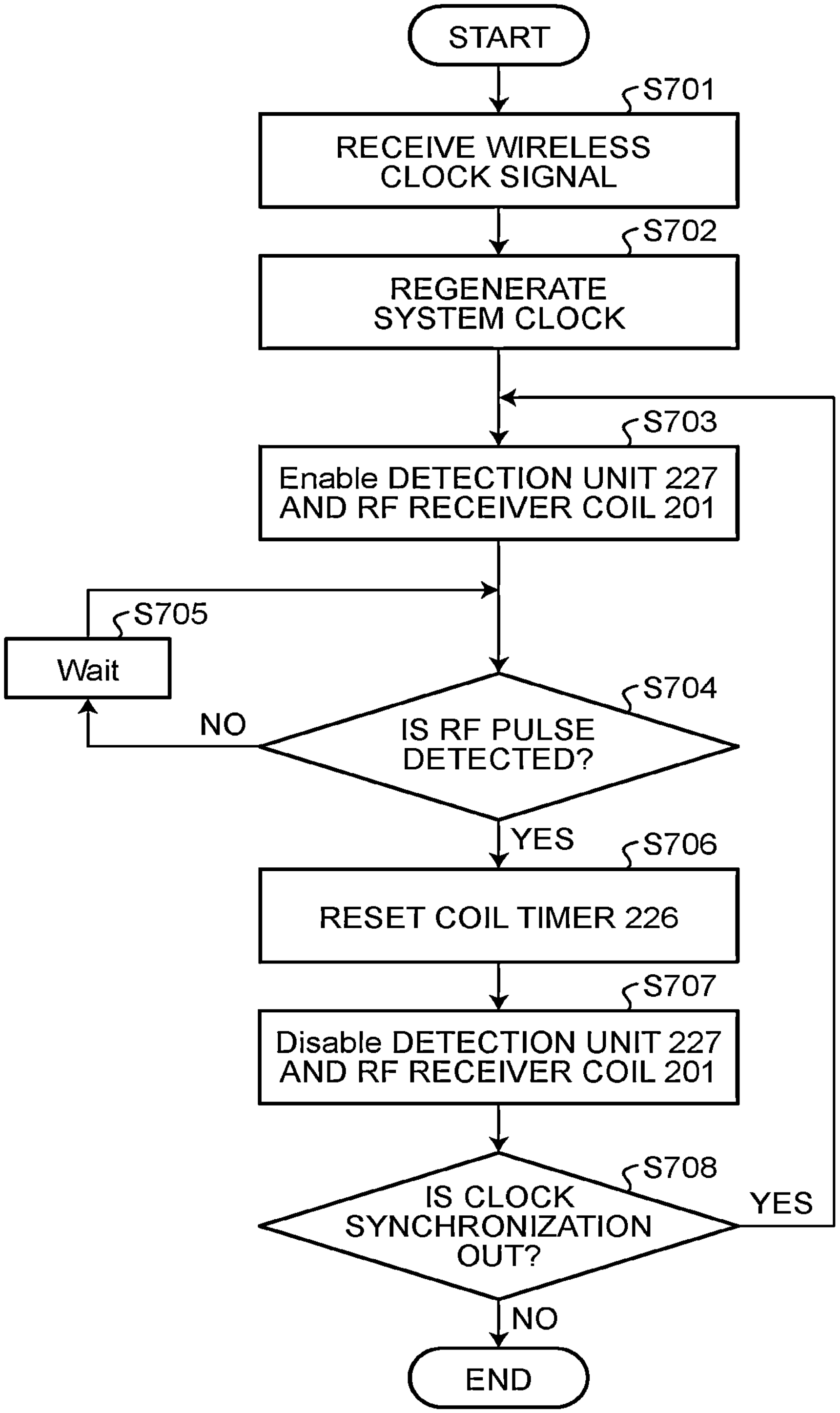
FIG. 7 is a flowchart of synchronization processing executed by a control unit.

FIG. 7 is a flowchart of synchronization processing executed by the control unit 208.

At S701, the control unit 208 receives a wireless clock signal. At S702, the control unit 208 regenerates a system clock from the received wireless clock signal.

At S703, the control unit 208 enables the detection unit 227 and the RF receiver coil 201 in response to a start notification of the timer synchronization processing transmitted from the control unit 221 of the main unit 101 via the data communication unit 204 or the clock transfer unit 206.

At S704, the control unit 208 determines whether an RF pulse is detected, and waits at S705 until an RF pulse is detected. Upon detecting an RF pulse, the processing of the control unit 208 proceeds to S706.

At S706, the control unit 208 regenerates the synchronization timing from the detected RF pulse, and resets the coil timer 226 at the regenerated synchronization correction timing to establish synchronization with the main timer 119.

At S707, the control unit 208 disables the detection unit 227 and the RF receiver coil 201. This is the control for preventing the detection unit 227 and the RF receiver coil 201 from responding to an RF pulse during imaging.

At S708, the control unit 208 detects whether the system clock is out of synchronization, and if so, repeats the operation from S703 to establish timer synchronization again after the system clock is synchronized again. Note here that the control unit 208 is an example of an out-of-synchronization detection unit.

If the system clock is not out of synchronization at S708, the control unit 208 ends the timer synchronization processing.

It is assumed herein that whether the system clocks are out of synchronization is determined by a PLL lock detection circuit provided to the clock receiver unit 303. Lock detection may be determined based on a threshold regarding the phase difference by making a phase comparison in the PLL, or may be determined using another method.

Subsequently, the operations of the main unit 101 and the coil unit 102 for synchronizing the timers before starting imaging will be described.

Figure 8:
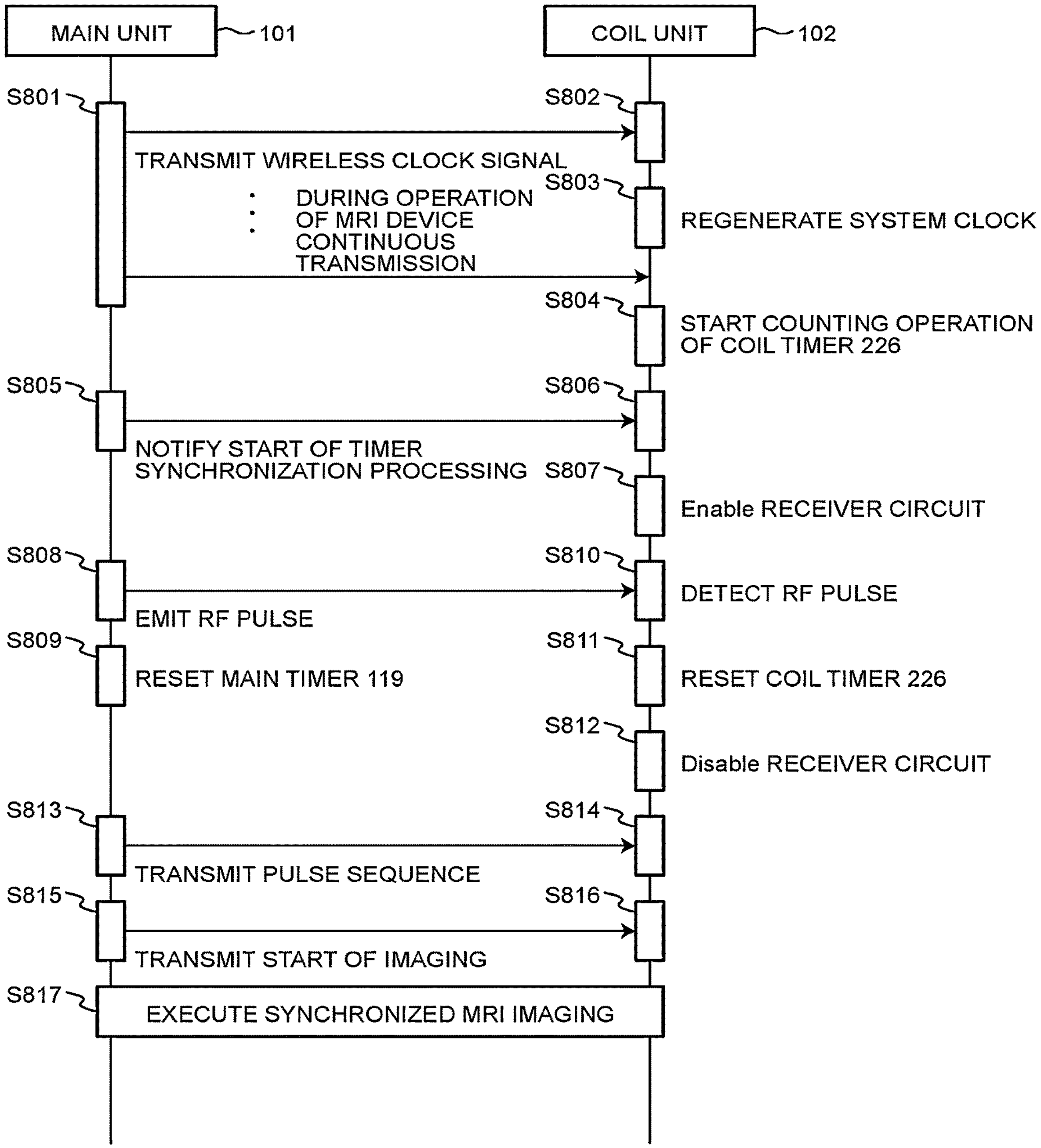
FIG. 8 is a sequence chart indicating timer synchronization processing of a main unit and the coil unit.

FIG. 8 is a sequence chart indicating timer synchronization processing of the main unit 101 and the coil unit 102.

The main unit 101 transmits a wireless clock signal at S801, and the coil unit 102 receives the transmitted wireless clock signal at S802.

At S803, the coil unit 102 regenerates the system clock from the wireless clock signal.

It is assumed herein that the wireless clock signal is continuously transmitted during the operation from the time the power of the MRI apparatus is turned on, and that the system clock is constantly regenerated in the coil unit 102.

At S804, the coil timer 226 starts a counting operation by the system clock. The main timer 119 of the main unit 101 starts a counting operation from the point at which the system clock is supplied when the power is turned on.

The main unit 101 transmits a start notification of the timer synchronization processing by the data communication unit 222 at S805, and the coil unit 102 receives the start notification of the timer synchronization processing by the data communication unit 204 at S806.

At S807, the coil unit 102 enables the detection unit 227 and the RF receiver coil 201.

At S808, the main unit 101 emits the RF pulse for transferring the synchronization correction timing.

At S809, the main unit 101 resets the main timer 119 at the timing where the RF pulse for transferring the synchronization correction timing is emitted.

At S810, the coil unit 102 detects the RF pulse and regenerates the synchronization correction timing.

At S811, the coil unit 102 establishes timer synchronization with the main timer 119 by resetting the coil timer 226 at the regenerated synchronization correction timing.

At S812, the coil unit 102 disables the detection unit 227 and the RF receiver coil 201.

At S813, the main unit 101 transmits a pulse sequence by the data communication unit 222.

At S814, the coil unit 102 receives the pulse sequence by the data communication unit 204, and stores it in the memory.

At S815, the main unit 101 transmits a start timer value as the imaging start timing, and waits until the main timer 119 matches the start timer value.

At S816, the coil unit 102 receives the imaging start timing, and waits until the coil timer 226 matches the start timer value.

At S817, MRI imaging is executed synchronously at the point where the main timer 119 and the coil timer 226 match the start timer value.

In the present embodiment, a delay from the point where the synchronization correction timing is generated by the imaging control unit 117 to the point where it is regenerated by the detection unit 227 of the coil unit 102 is a synchronization error between the main timer 119 and the coil timer 226. Therefore, the transmission delay of the RF pulse may be set in advance as the timer initial value at reset.

Furthermore, the technology disclosed in the present application is also implemented by executing the following processing. That is, it is the processing executed by supplying software (computer program) that implements the functions of the embodiment described above to a system or an apparatus via a network or various kinds of storage media, and reading out the computer program by a computer (or CPU, micro processing unit (MPU), or the like) of the system or the apparatus. It may also be executed by a circuit (for example, application specific integrated circuit (ASIC)) that implements one or more functions.

Another Embodiment

In the embodiment described above, the main unit 101 resets the main timer 119 at the timing of transmitting the synchronization correction timing, and the coil unit 102 resets the coil timer 226 at the received synchronization correction timing to establish the timer synchronization.

As another embodiment, for example, timer synchronization may be implemented by correcting the main timer 119 or the coil timer 226 through calculating a correction value from the timer values of the timers based on synchronization correction timing.

Figure 9:
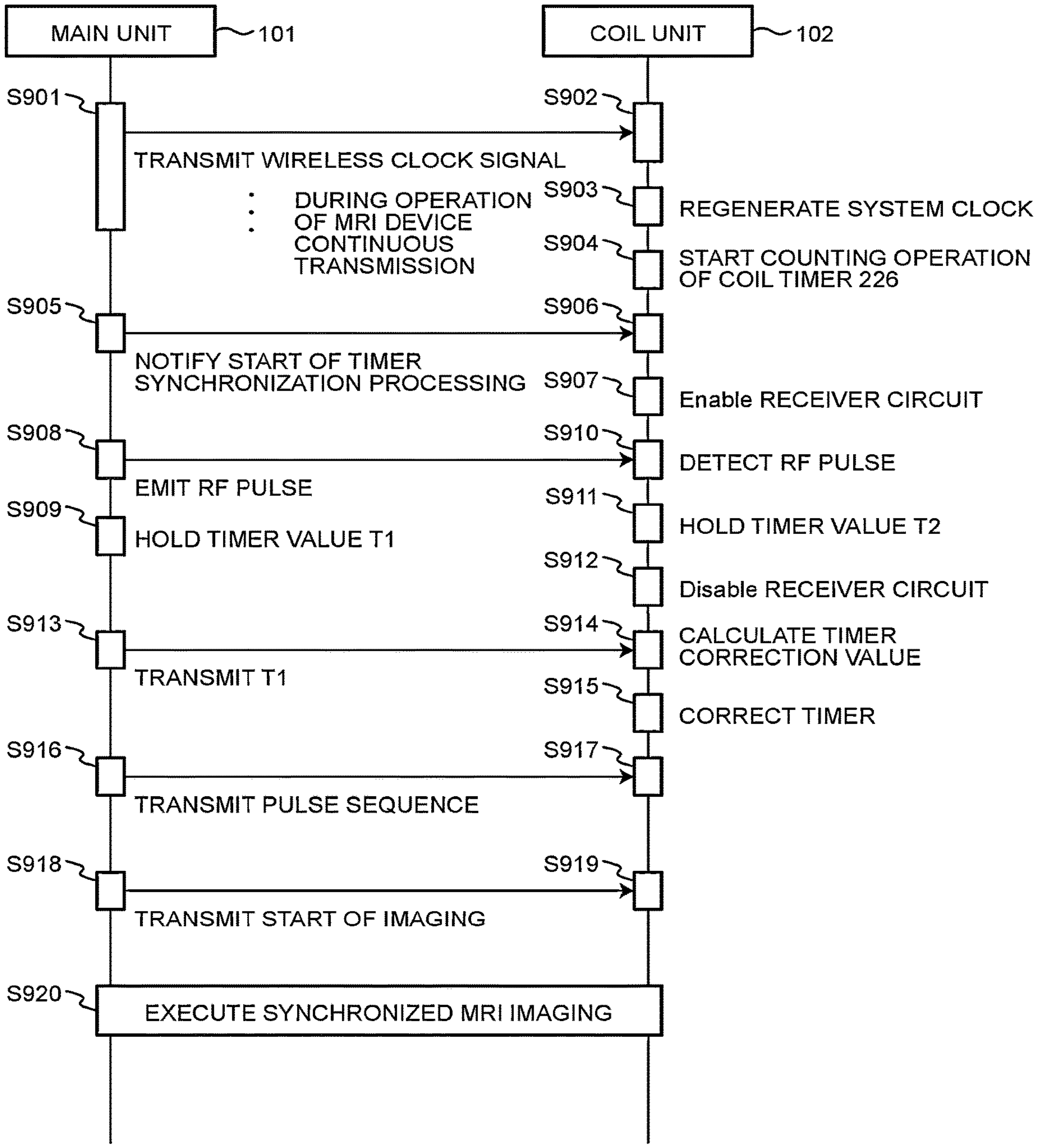
FIG. 9 is a sequence chart indicating timer synchronization processing of the main unit and the coil unit according to another embodiment.

FIG. 9 is a sequence chart indicating timer synchronization processing of the main unit 101 and the coil unit 102 according to another embodiment.

Since the processing of S901 to S908 is the same as that of S801 to S808, the explanation is omitted.

At S909, the main unit 101 acquires a timer value T1 of the main timer 119 at the synchronization correction timing, and holds it in the memory.

At S910, the coil unit 102 detects the RF pulse and regenerates the synchronization correction timing.

At S911, the coil unit 102 acquires a timer value T2 of the coil timer 226 at the regenerated synchronization correction timing, and holds it in the memory.

At S912, the coil unit 102 disables the detection unit 227 and the RF receiver coil 201.

At S913, the main unit 101 transmits the timer value T1 by the data communication unit 222.

At S914, the coil unit 102 receives the timer value T1 by the data communication unit 204. Then, the control unit 208 of the coil unit 102 calculates a timer correction value Td of the coil timer 226 by the following formula (1).

$$Td = T2 - T1 \qquad \text{Formula (1)}$$

At S915, the control unit 208 of the coil unit 102 establishes timer synchronization with the main timer 119 by correcting the coil timer 226 with the timer correction value Td.

Since the processing of S916 to S920 is the same as that of S813 to S817, the explanation is omitted.

Note that the main unit 101 transmits the timer value T1 to the coil unit 102 and the coil unit 102 corrects the coil timer 226 at S913 to S915 herein to establish timer synchronization. However, the embodiment is not limited thereto. For example, the coil unit 102 may transmit the timer value T2 to the main unit 101, and the main unit 101 may calculate the difference in the timer values and correct the main timer 119 at S913 to S915 to establish timer synchronization.

Furthermore, the coil unit 102 may set Td as the initial value of the coil timer 226 instead of correcting the coil timer 226 at S915, and the main timer 119 and the coil timer 226 may be reset at the time of notification of the imaging start timing at S918 to establish the timer synchronization. In this case, the main unit 101 transmits the imaging start timing at S918 by the RF pulse as in the case of the synchronization correction timing, which enables synchronized imaging by taking into account the propagation delay and the internal delay of the transmitter/receiver circuit.

Furthermore, while the RF pulse generation unit 109 and the RF receiver coil 201 are used in the embodiments described above as a unit for transmitting the synchronization correction timing, the unit is not limited thereto. For example, wireless signals in the frequency bands used in the IEEE 802.11 standard, Bluetooth (registered trademark), NFC, UWB, Zigbee, MBOA, and the like may also be used.

According to the embodiments described above, accuracy of imaging synchronization control of the wireless coil unit 102 with respect to the main unit 101 can be improved by reducing the shift in the timing at which the control signal changes due to fading, while suppressing the cost as the circuit to be added to the coil unit 102.

In the embodiments described above, for example, each of the processing units included in the main unit 101 and the coil unit 102 may also be implemented by a single piece of or a plurality of pieces of processing circuitry. In this case, the processing circuitry is implemented by, for example, a processor. In this case, the processing functions of the processing circuitry are stored in a storage in the form of a computer program that can be executed by a computer, for example. Then, the processing circuitry reads out and executes the computer programs from the storage to implement the processing functions corresponding to the computer programs.

Note here that the processing circuitry, for example, may be configured with a combination of a plurality of independent processors to implement each of the processing functions by executing the computer programs with each of the processors. Furthermore, the processing functions of the processing circuitry may be distributed or integrated into a single piece of or a plurality of pieces of processing circuitry as appropriate. The storage in which the computer programs corresponding to the processing functions are stored may be a single storage. Alternatively, a plurality of storages may be arranged in a distributed manner for each piece of the processing circuitry, and each piece of the processing circuitry may read out the corresponding computer program from the individual storage.

Furthermore, each of the processing units included in the main unit 101 and the coil unit 102 may be implemented by hardware alone, software alone, or a combination of hardware and software, in addition to being implemented by the processing circuitry.

While an example in which a "processor" reads out and executes a computer program corresponding to each of the processing functions from a storage is described above, the embodiments are not limited thereto. The term "processor" means, for example, a circuit such as a central processing unit (CPU), a graphics processing unit (GPU), an application specific integrated circuit (ASIC), a programmable logic device (for example, a simple programmable logic device (SPLD), a complex programmable logic device (CPLD), and a field programmable gate array (FPGA)). When the processor is a CPU, for example, the processor reads out and executes the computer program stored in the storage to implement each of the processing functions. On the other hand, when the processor is an ASIC, the processing function is directly installed in the circuit of the processor as the logic circuit, instead of saving the computer program in the storage. Note that each of the processors of the present embodiments is not limited to being configured as a single circuit for each processor, and may also be configured as a single processor by combining a plurality of independent circuits to implement the processing functions. Furthermore, it is also possible to integrate a plurality of structural components in FIG. 1 into a single processor to implement the processing functions.

Note here that the computer program to be executed by the processor is provided by being installed in advance in a read-only memory (ROM), a storage, or the like. The computer program may be provided in a file of format that can be installed on such devices or in an executable format by being recorded on a computer readable non-transitory storage medium such as a compact disc (CD)-ROM, a flexible disk (FD), a CD-recordable (R), a digital versatile disc (DVD), or the like. Furthermore, the computer program may also be stored on a computer connected to a network such as the Internet, and provided or distributed by being downloaded via the network. For example, the computer program is configured with modules including each of the functional units described above. As for the actual hardware, the CPU reads out and executes the computer program from a storage medium such as a ROM, so that each of the modules is loaded onto a main memory device and generated on the main memory device.

Furthermore, in the embodiments described above, each of the structural components of each of the illustrated apparatuses is the functional concept and is not necessarily need to be physically configured as illustrated in the drawings. In other words, the specific forms of distribution and integration of the apparatuses are not limited to those illustrated in the drawings, but all or some of them can be functionally or physically distributed or integrated in any unit in accordance with various kinds of load, use state, or the like. Furthermore, all or some of the processing functions performed by respective apparatuses can be implemented by the CPU and the computer program that is analyzed and executed by the CPU, or may be implemented by hardware using wired logic.

Regarding the processing described in the above embodiments, all or several pieces of the processing described to be performed automatically can be performed manually, or all or several pieces of the processing described to be performed manually can be performed automatically using a known method. In addition to the above, the processing procedures, control procedures, specific names, and information including various kinds of data and parameters discussed in the description and drawings can be changed as appropriate, unless otherwise noted.

According to at least one of the embodiments described above, it is possible to improve accuracy of imaging synchronization control of the wireless coil apparatus with respect to the main apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
- a main apparatus; and
- a coil apparatus that is separate from the main apparatus, wherein
- the main apparatus comprises:
  - first processing circuitry configured to:
    - generate a synchronization clock:
    - generate a first wireless signal based on the synchronization clock and then transmit the first wireless signal to the coil apparatus by wireless communication; and
    - generate a second wireless signal based on the synchronization clock and then transmit the second wireless signal to the coil apparatus by wireless communication; and
  - a first timer configured to operate on a synchronization clock,
- the coil apparatus comprises:
  - second processing circuitry configured to:
    - regenerate the synchronization clock from the first wireless signal transmitted by the main apparatus; and
    - detect a timing where the second wireless signal transmitted by the main apparatus is received; and
  - a second timer configured to operate on the synchronization clock, and
- a synchronized imaging operation is performed by correcting at least one of the first timer provided to the main apparatus and the second timer provided to the coil apparatus in accordance with the timing.

2. The magnetic resonance imaging apparatus according to claim 1, wherein the main apparatus resets the first timer at a timing of transmitting the second wireless signal.

3. The magnetic resonance imaging apparatus according to claim 1, wherein the coil apparatus resets the second timer at a timing of receiving the second wireless signal.

4. The magnetic resonance imaging apparatus according to claim 1, wherein the main apparatus holds a first timer value of the first timer at a timing of transmitting the second wireless signal.

5. The magnetic resonance imaging apparatus according to claim 1, wherein the coil apparatus holds a second timer value of the second timer at a timing of receiving the second wireless signal.

6. The magnetic resonance imaging apparatus according to claim 5, wherein one of the first timer and the second timer is corrected based on a difference between a timer value of the first timer and a timer value of the second timer.

7. The magnetic resonance imaging apparatus according to claim 1, wherein the second processing circuitry is further configured to:

detect whether the regenerated synchronization clock is out of synchronization; and when the synchronization clock is out of synchronization, correct at least one of the first timer and the second timer in accordance with the timing detected by the processing circuitry, after the synchronization clock is synchronized again.

8. The magnetic resonance imaging apparatus according to claim 1, wherein the second wireless signal is a wireless signal at a frequency that is included in a frequency band of Larmor frequency used for imaging.

9. The magnetic resonance imaging apparatus according to claim 8, wherein the second wireless signal is transmitted with weaker signal intensity than signal intensity of the wireless signal at the Larmor frequency used for the imaging.

10. The magnetic resonance imaging apparatus according to claim 1, wherein the first wireless signal is a wireless signal in a frequency band used for a wireless local area network (LAN).

11. The magnetic resonance imaging apparatus according to claim 1, wherein the main apparatus transmits the second wireless signal as a radio frequency (RF) pulse signal, the coil apparatus further comprises an RF receiver coil configured to receive the second wireless signal, and the second processing circuitry is further configured to detect the timing by detecting an envelope of the second wireless signal received by the RF receiver coil.

12. A magnetic resonance imaging apparatus, comprising:

a main apparatus; and a coil apparatus that is separate from the main apparatus, wherein the main apparatus comprises a first timer configured to operate on a synchronization clock, the coil apparatus comprises:

processing circuitry configured to:

regenerate the synchronization clock from a first wireless signal transmitted by the main apparatus; and detect a timing where a second wireless signal transmitted by the main apparatus is received; and a second timer configured to operate on the synchronization clock, and a synchronized imaging operation is performed by correcting at least one of the first timer provided to the main apparatus and the second timer provided to the coil apparatus in accordance with the timing, and the coil apparatus resets the second timer at a timing of receiving the second wireless signal.

13. A magnetic resonance imaging apparatus, comprising:

a main apparatus; and a coil apparatus that is separate from the main apparatus, wherein the main apparatus comprises a first timer configured to operate on a synchronization clock, the coil apparatus comprises:

processing circuitry configured to:

regenerate the synchronization clock from a first wireless signal transmitted by the main apparatus; and detect a timing where a second wireless signal transmitted by the main apparatus is received; and a second timer configured to operate on the synchronization clock, and a synchronized imaging operation is performed by correcting at least one of the first timer provided to the main apparatus and the second timer provided to the coil apparatus in accordance with the timing, and the processing circuitry is further configured to:

detect whether the regenerated synchronization clock is out of synchronization; and when the synchronization clock is out of synchronization, correct at least one of the first timer and the second timer in accordance with the timing detected by the processing circuitry, after the synchronization clock is synchronized again.

14. A magnetic resonance imaging apparatus, comprising:

a main apparatus; and a coil apparatus that is separate from the main apparatus, wherein the main apparatus comprises a first timer configured to operate on a synchronization clock, the coil apparatus comprises:

processing circuitry configured to:

regenerate the synchronization clock from a first wireless signal transmitted by the main apparatus; and detect a timing where a second wireless signal transmitted by the main apparatus is received; and a second timer configured to operate on the synchronization clock, a synchronized imaging operation is performed by correcting at least one of the first timer provided to the main apparatus and the second timer provided to the coil apparatus in accordance with the timing, the second wireless signal is a wireless signal at a frequency that is included in a frequency band of Larmor frequency used for imaging, and the second wireless signal is transmitted with weaker signal intensity than signal intensity of the wireless signal at the Larmor frequency used for the imaging.

* * * * *